(12) United States Patent
Longueville

(10) Patent No.: US 6,435,906 B1
(45) Date of Patent: *Aug. 20, 2002

(54) PRINTED CIRCUIT BOARD ELECTRICAL CONNECTOR WITH ANCHORING DEVICE

(75) Inventor: Jacques Longueville, Oostkamp (BE)

(73) Assignee: Tyco Electronics Logistics AG, Steinach (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/164,116

(22) Filed: Sep. 30, 1998

(30) Foreign Application Priority Data

Sep. 30, 1997 (DE) .......................... 197 43 251

(51) Int. Cl.[7] ............................... H01R 13/66
(52) U.S. Cl. .................... 439/570; 439/79; 439/329; 439/565

(58) Field of Search ............................ 439/570, 79, 83, 439/329, 567, 565

(56) References Cited

U.S. PATENT DOCUMENTS

| | | | | |
|---|---|---|---|---|
| 4,842,554 A | * | 6/1989 | Cosmos et al. | 439/609 |
| 5,785,537 A | * | 7/1998 | Donahue et al. | 439/79 |
| 5,863,222 A | * | 1/1999 | Kinset, Jr. et al. | 439/607 |

* cited by examiner

*Primary Examiner*—Tho D. Ta
*Assistant Examiner*—Truc Nguyen
(74) *Attorney, Agent, or Firm*—Laurence A. Greenberg; Werner H. Stemer; Gregory L. Mayback

(57) ABSTRACT

An electrical connector for assembly on a printed circuit board, the electrical connector having connecting elements for connecting the electrical connector at least electrically to the printed circuit board, and including an anchoring device for mechanically connecting the electrical connector to the printed circuit board, the anchoring device including a multiplicity of anchoring elements arranged side by side and formed so as to be solderable to the printed circuit board.

6 Claims, 2 Drawing Sheets

PRINTED CIRCUIT BOARD ELECTRICAL CONNECTOR WITH ANCHORING DEVICE

BACKGROUND OF THE INVENTION

Field of the Invention

The invention relates to an electrical connector for assembly on a printed circuit board, the electrical connector having connecting elements for connecting the electrical connector at least electrically to the printed circuit board, and including an anchoring device for mechanically connecting the electrical connector to the printed circuit board.

A multiplicity of different versions of such electrical connectors have become known heretofore. The connecting elements by which the electrical connectors are connected at least electrically to the printed circuit board are, in this regard, frequently connecting elements which are formed so as to be soldered to the printed circuit board by the Surface Mount Technology ("SMT") soldering method.

Particularly in the case of connecting elements which are formed in such a manner, as well as in the case of other types of connecting elements, there is a risk of these connecting elements being detached from the printed circuit board if the electrical connector is subjected to severe mechanical stress (if the electrical connector moves relative to the printed circuit board), due to which the electrical contact with the printed circuit board is intermittently or permanently interrupted, or at least deteriorates.

In order to avoid such an occurrence, some of the electrical connectors are fitted with anchoring devices by which they are so firmly connected mechanically to the printed circuit board that any movement of the electrical connectors relative to the printed circuit board is prevented, or at least considerably constrained.

Examples of such anchoring devices are latching hooks which are provided on the electrical connector and which, when the electrical connector is being mounted on or assembled with the printed circuit board, latch with associated latching elements on the printed circuit board, such as, for example, with recesses formed in the printed circuit board. Anchoring devices of the foregoing and other heretofore known types do not, however, connect the electrical connector and the printed circuit board completely firmly to one another. There is always a certain amount of play, as a result of which movements of the electrical connector relative to the printed circuit board are not entirely prevented. Even very small freedoms of movement can result, over time, to the connecting elements of the electrical connector becoming detached from the printed circuit board. This is a disadvantage which must be overcome.

SUMMARY OF THE INVENTION

It is accordingly an object of the invention to provide an electrical connector of the foregoing general type which is connectable to a printed circuit board in such a manner that any movements of the electrical connector relative to the printed circuit board, which would have an adverse effect upon the electrical connection between the electrical connector and the printed circuit board, are reliably and permanently prevented to the greatest extent.

With the foregoing and other objects in view, there is provided, in accordance with a first aspect of the invention, an electrical connector for assembly on a printed circuit board, the electrical connector having connecting elements for connecting the electrical connector at least electrically to the printed circuit board, and comprising an anchoring device for mechanically connecting the electrical connector to the printed circuit board, the anchoring device including a multiplicity of anchoring elements arranged side by side and formed so as to be solderable to the printed circuit board.

In accordance with another feature of the invention, the anchoring elements are of such form as to be solderable to the printed circuit board by a SMT soldering method.

In accordance with a further feature of the invention, the anchoring elements, respectively, have at least one projection which is formed as a soldering lug.

In accordance with another aspect of the invention, there is provided, in an assembly of the electrical connector with the printed circuit board, the anchoring elements are connected to the electrical connector on a side of the electrical connector facing towards the printed circuit board.

In accordance with a concomitant feature of the invention, the connecting elements and the anchoring elements are formed so as to be connectable to the printed circuit board on opposite sides of the electrical connector.

Thus, the anchoring device comprises a multiplicity of anchoring elements which are arranged side by side or in tandem, and are constructed for soldering to the printed circuit board.

The construction of the anchoring device for soldering to the printed circuit board permits the formation of a mechanical joint without any play between the electrical connector and the printed circuit board.

The subdivision of the altogether substantially strip-type anchoring device into a multiplicity of individual anchoring elements permits, in this regard, a more reliable mechanical joint to be produced between the electrical connector and the printed circuit board than would be possible if the anchoring device were constructed as a connected anchoring strip.

The large number of soldering locations which are produced by the soldering of the individual anchoring elements to the printed circuit board means that the anchoring device, which is, in essence, striplike overall, can be firmly connected to the printed circuit board uniformly over the entire length thereof; locally weaker joints, such as those which can occur when a connected anchoring strip is used are in this way prevented, because solder paste is spread around within the then very large solder area during the soldering process (flowing together locally in an unpredictable manner), and/or the anchoring strip expands and contracts differently than the printed circuit board during and after the soldering process.

Consequently, an electrical connector has been created which can be connected to the printed circuit board in such a way that any movements of the electrical connector relative to the printed circuit board which adversely affect the electrical connection between the electrical connector and the printed circuit board are reliably and lastingly prevented, to the greatest extent.

On the other hand, however, the multiplicity of anchoring elements give the anchoring device a mobility which, to a given extent, allows it to follow desirable or necessary movements, such as vibration or thermally caused expansion or shrinkage, for example, of the electrical connector and/or of the printed circuit board which may occur, without damaging the electrical connector, the printed circuit board and/or the soldering locations. Conversely, movement, expansion or shrinkage of the anchoring elements caused by thermal action or other circumstances do not lead to any damage to the electrical connector, the printed circuit board and/or the soldering locations, either. Although the electrical connector and the anchoring elements therefor can be extremely firmly joined mechanically to the printed circuit board, they can consequently carry out movements, the suppression of which could adversely affect, i.e., weaken or interrupt, the electrical contact between the electrical connector and the printed circuit board.

Other features which are considered as characteristic for the invention are set forth in the appended claims.

Although the invention is illustrated and described herein as embodied in an electrical connector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

DESCRIPTION OF THE PREFERRED EMBODIMENTS

Figure 1:
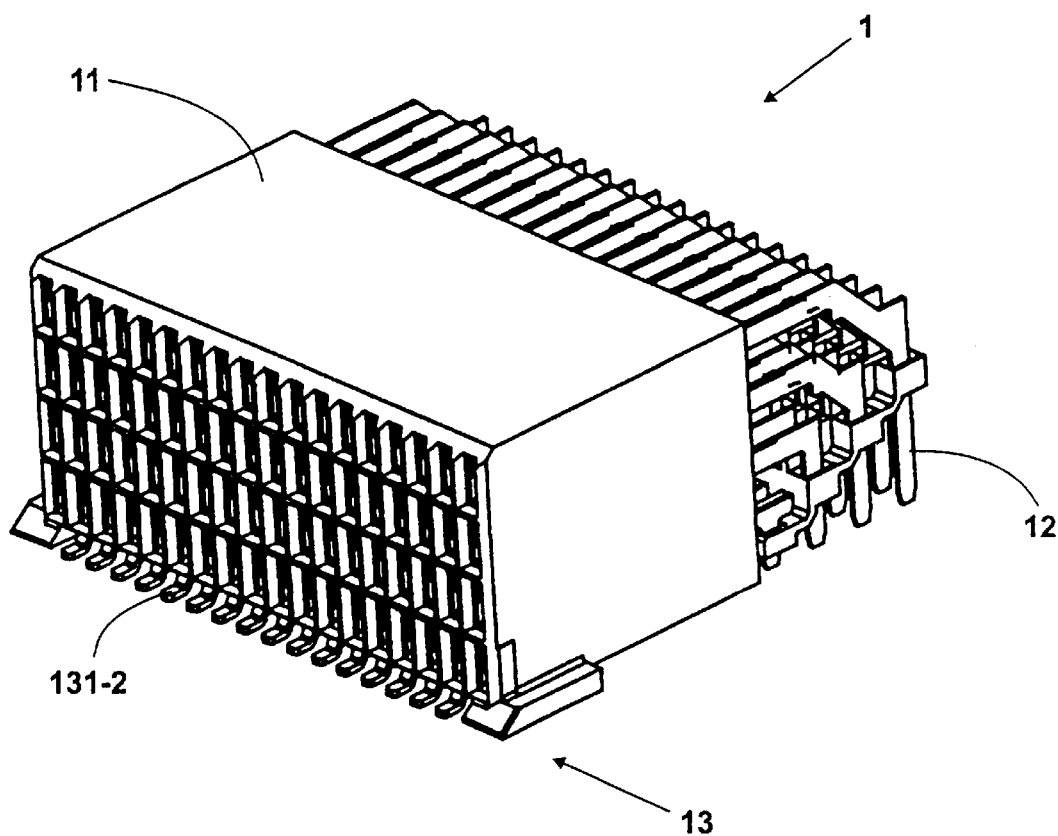
FIG. 1 is a perspective view of an exemplary embodiment of the novel electrical connector according to the invention.

Referring now to the drawings and, first, particularly to FIG. 1 thereof, there is shown therein an electrical connector 1 according to the invention which is formed so as to be butt-soldered to the surface of a printed circuit board 2 (note FIG. 4), that is to say, by using a SMT soldering method, for example. When the electrical connector 1 is mounted on or assembled with the printed circuit board 2, the electrical connector 1 serves to connect this printed circuit board 2 to another printed circuit board which is not shown in the figures of the drawings; in the example under consideration, the printed circuit board 2 (for example a so-called module printed circuit board) is designed to be plugged substantially perpendicularly to the other printed circuit board (for example a so-called backplane or rear wall printed circuit board). In fact, the use of the electrical connector is not limited to such cases. It can also be constructed for other types of connections of two or more printed circuit boards and, in addition or alternatively, for the connection of a cable or other devices.

The electrical connector 1 in the exemplary embodiment under consideration is a plug connector. However, the invention can also be used in the case of other types of electrical connectors, for example, in the case of push-on connectors for making contact with surface contacts, and so forth. Inter alia, the electrical connector may also be constructed as a zero-force plug connector or a floating connector, or may have other special physical forms.

As is apparent from FIG. 1, the electrical connector 1 includes a housing 11, a multiplicity of connecting elements 12 and an anchoring device 13.

The connecting elements 12 are formed so as to be butt-soldered to the surface of the printed circuit board 2, for example, through the use of a SMT soldering method; the connecting elements 12 serve, in particular, for electrically connecting the electrical connector 1 to the printed circuit board 2, but simultaneously also ensure an admittedly only slightly loadable mechanical connection between the electrical connector 1 and the printed circuit board 2.

The anchoring device 13 is likewise formed so as to be butt-soldered to the surface of the printed circuit board 2, for example, by using a SMT soldering method; the anchoring device 13 serves for mechanically connecting the electrical connector 1 to the printed circuit board 2.

Figure 2:
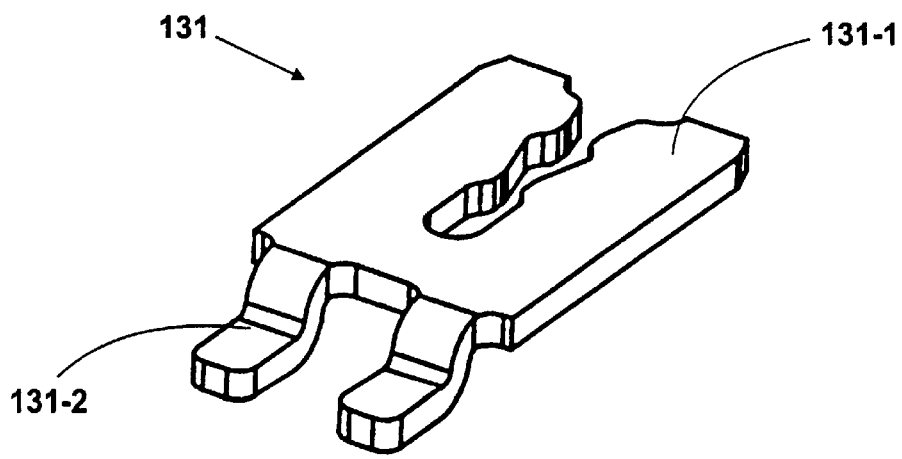
FIG. 2 is a perspective view of an individual anchoring element of the electrical connector according to FIG. 1.
Figure 3:
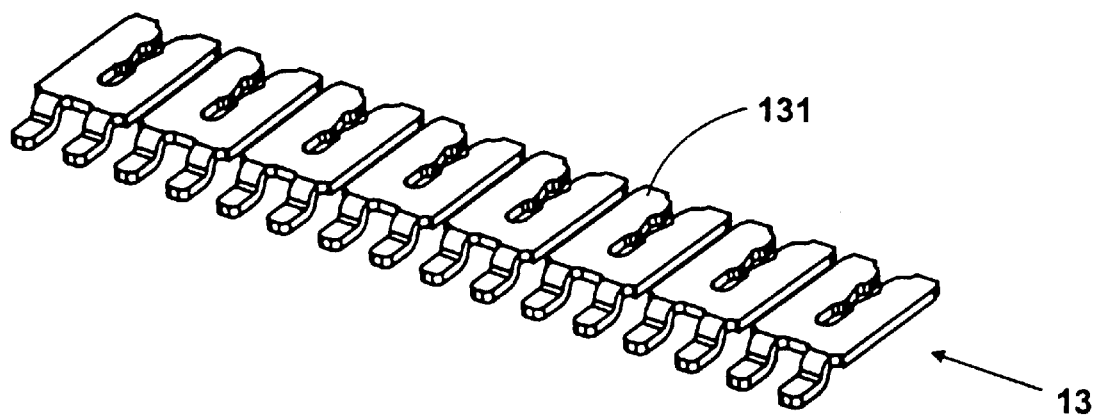
FIG. 3 is a perspective view of a plurality of anchoring elements according to FIG. 2 which are arranged side by side or alongside one another.

The anchoring device 13 includes a multiplicity of anchoring elements 131 which are arranged side by side or alongside one another, an individual one thereof being shown in FIG. 2, and a plurality or multiplicity thereof arranged in a row side-by-side one another being shown in FIG. 3.

As can be seen in particular from FIG. 2, the anchoring elements comprise a fastening section 131-1 and two, or possibly alternatively more or less, finger-like projections 131-2 which are formed as soldering lugs.

The fastening sections 131-1 in the example under consideration are plate-like sections with a U-shaped outline; they are formed so as to be fastened to or integrated in the housing 11 on the side of the housing 11 facing towards the printed circuit board 2.

The projections 131-2 or, more precisely, the free end sections thereof, are formed so as to be soldered to the printed circuit board 2.

The anchoring device 13 is formed by an exemplary side-by-side arrangement in a row, as shown in FIG. 3, of a multiplicity of anchoring elements 131 according to FIG. 2. The individual anchoring elements 131 can, in this regard, directly abut or contact one another or be spaced at greater or lesser distances from one another. Care should be taken, however, that the anchoring elements 131, by being arranged in a row, be not combined at all into a long, rigid anchoring strip, but remain individual anchoring elements which act and react independently of one another; it would appear, as a rule, to be advantageous if adjacent anchoring elements are at least slightly spaced apart from one another.

By arranging the anchoring elements 131 in a row, a multiplicity of soldering lugs 131-2 become located side-by-side or alongside one another and can be individually soldered to the printed circuit board.

Figure 4:
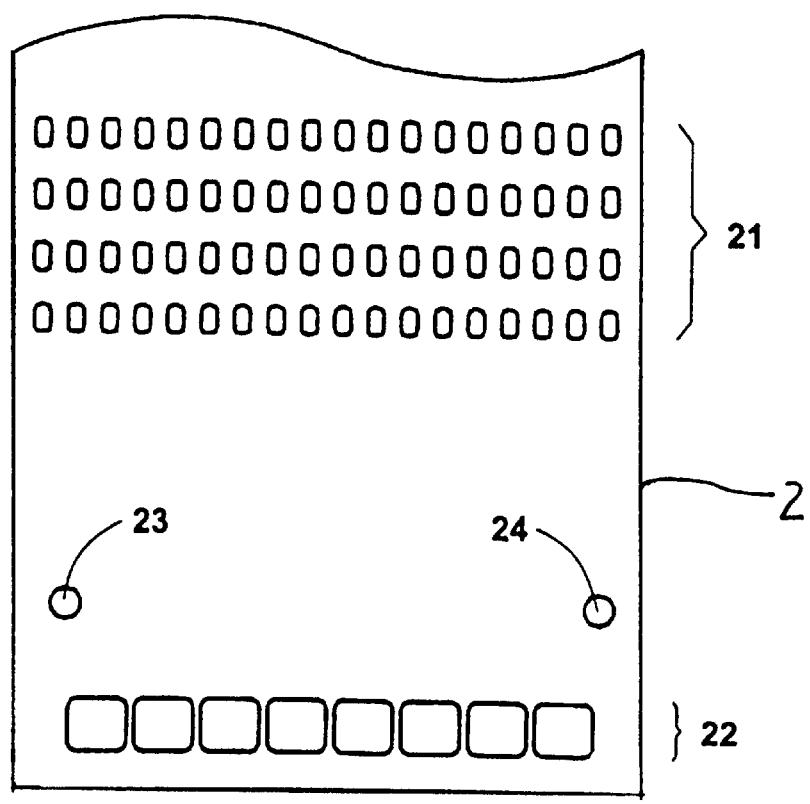
FIG. 4 is a fragmentary plan view of a printed circuit board provided for the electrical connector according to FIG. 1 to be mounted thereon or assembled therewith.

A part of the printed circuit board 2 on which the electrical connector 1, constructed as described hereinbefore, is to be mounted is illustrated in a plan view in FIG. 4.

As is apparent from FIG. 4, in the region wherein the electrical connector 1 is to be mounted, the printed circuit board 2 comprises a first group 21 of soldering locations provided for soldering by a SMT method, a second group 22 of soldering locations provided for soldering by a SMT method, and recesses 23 and 24 formed in the printed circuit board 2.

The first group 21 of soldering locations is intended for soldering the connecting elements 12 thereon, the second group 22 of soldering locations is provided for soldering the soldering lugs 132-2 of the anchoring elements 131 thereon, and the recesses 23 and 24 are provided for accommodating non-illustrated pins of the electrical connector 1 in order to correctly position the connector 1 on the printed circuit board 2.

In the correctly mounted or assembled condition of the electrical connector 1 on the printed circuit board 2, the former is located between the first group 21 of soldering locations and the second group 22 of soldering locations.

In the exemplary embodiment under consideration, the connecting elements 12 and the anchoring device 13 are arranged on opposite sides of the electrical connector 1. This has been found to be particularly advantageous because lifting the electrical connector on the side thereof opposite the connecting elements 12 can particularly easily and quickly cause the soldering joints between the connecting elements 12 and the first group 21 of solder points to tear apart. Nevertheless, the connecting elements 12 and the anchoring device 13 may also have other relative positions and orientations.

Due to the multiplicity of individual soldering locations via which the anchoring device 13 is connected to the printed circuit board 2, a reliably and permanently firm connection is produced between the electrical connector 1 and the printed circuit board 2. On the one hand, namely, each individual soldering location may be perfectly formed so that a uniformly good connection between the anchoring device 13 and the printed circuit board 2 can be achieved over the entire length of the anchoring device 13 which is formed substantially striplike overall; on the other hand, these soldering locations are loadable from any direction, because the soldering paste can be drawn along on all sides and can be distributed uniformly all around the projections 131-2 of the anchoring elements 131.

This positive effect is reinforced if not just one large connected soldering area is provided on the printed circuit board 2 for the multiplicity of anchoring elements 131 but, as is shown by way of example in FIG. 4, there are a plurality of individual soldering islands; in the example under consideration, a specific soldering island is allocated to each anchoring element 131. It is then additionally possible to prevent the soldering paste from running out of the individual regions during the soldering process and collecting at other locations, which would result in the electrical connector 1 and the anchoring device 13 thereof, respectively, and the printed circuit board 2 being connected with different degrees of firmness locally.

The construction of the anchoring device 13, as described hereinafter, and the play-free connection thereof to the printed circuit board 2 permit relative movements between the electrical connector 1 and the printed circuit board 2, that is, relative movements which stress the connections between the connecting elements 12 and the printed circuit board 2, to be substantially completely suppressed.

On the other hand, the connection between the anchoring device 13 and the printed circuit board 2 is not completely rigid due to the subdivision of the anchoring device 13 into a large number of individual anchoring elements, so that, to a certain extent, some relative movements are possible between the electrical connector 1 and the printed circuit board 2. In particular, the individual anchoring elements can follow, essentially independently of one another, any movement which may occur, such as vibration or thermally caused expansion or shrinkage, for example, of the electrical connector 1 and/or of the printed circuit board 2. Conversely, the electrical connector 1 and the printed circuit board 2 can locally follow movement, expansion or shrinkage of the anchoring elements caused by thermal effects or by other circumstances, as a result of which it is possible to avoid major stresses within the electrical connector 1 and/or the printed circuit board 2. This is a very significant aspect due to the various materials from which the electrical connector 1, the anchoring device 13 thereof, and the printed circuit board 2 are made or, to be more precise, the different stiffness and the different thermal behavior thereof.

The aforedescribed electrical connector 1 thus, on the one hand, suppresses relative movements between itself and the printed circuit board 2 which have an adverse effect upon the electrical contact between the connecting elements 12 and the printed circuit board 2 but, on the other hand, permits those relative movements the suppression of which could adversely affect the electrical contact between the connecting elements 12 and the printed circuit board 2.

I claim:

1. An electrical connector for assembly on a printed circuit board, the electrical connector comprising:

connecting elements for connecting the electrical connector at least electrically to the printed circuit board; and an anchoring device different from said connecting elements for mechanically connecting the electrical connector to the printed circuit board, said anchoring device including a plurality of anchoring elements disposed adjacent one another in a side-by-side relationship along the electrical connector, and each of said plurality of anchoring elements to be individually soldered to the printed circuit board by an SMT soldering method.

2. The electrical connector according to claim 1, wherein said anchoring elements have at least one projection which is formed as a soldering lug.

3. In an assembly of the electrical connector according to claim 1 with the printed circuit board, said anchoring elements being connected to the electrical connector on a side of the electrical connector facing towards the printed circuit board.

4. The electrical connector according to claim 1, wherein said connecting elements and said anchoring elements are formed so as to be connectable to the printed circuit board on opposite sides of the electrical connector.

5. The electrical connector according to claim 1, wherein said plurality of anchoring elements are disposed close together to form a multi-part and strip-like anchoring device formed of a multiplicity of individual and disconnected anchoring elements.

6. An electrical connector for assembly on a printed circuit board, the electrical connector comprising:

connecting elements for connecting the electrical connector at least electrically to the printed circuit board; and an anchoring device different from said connecting elements for mechanically connecting the electrical connector to the printed circuit board, said anchoring device including a plurality of anchoring elements disposed adjacent one another in a side-by-side relationship along the electrical connector without said connecting elements disposed therebetween, and each of said plurality of anchoring elements to be individually soldered to the printed circuit board by an SMT soldering method.

* * * * *